(12) United States Patent
Kim

(10) Patent No.: US 7,396,725 B2
(45) Date of Patent: Jul. 8, 2008

(54) METHOD OF MANUFACTURING SEMICONDUCTOR DEVICE

(75) Inventor: Soo Jin Kim, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 65 days.

(21) Appl. No.: 11/616,021

(22) Filed: Dec. 26, 2006

(65) Prior Publication Data

US 2008/0102575 A1     May 1, 2008

(30) Foreign Application Priority Data

Oct. 31, 2006   (KR) ...................... 10-2006-0106626

(51) Int. Cl.
*H01L 21/8234* (2006.01)

(52) U.S. Cl. ............... 438/275; 438/264; 438/700; 438/709; 257/E21.218; 257/E21.259

(58) Field of Classification Search ............ 438/581, 438/709, 721; 257/E21.051, E21.177, E21.4, 257/E21.457, E21.615
See application file for complete search history.

(56) References Cited

U.S. PATENT DOCUMENTS

2007/0284645 A1* 12/2007 Lee et al. ............... 257/314

2008/0002471 A1* 1/2008 Lee ......................... 365/185.17

FOREIGN PATENT DOCUMENTS

| KR | 10-2001-0063856 A | 7/2001 |
|---|---|---|
| KR | 10-2002-0076455 A | 10/2002 |
| KR | 10-2005-0052177 A | 6/2005 |
| KR | 10-2005-0073043 A | 7/2005 |
| KR | 10-2006-0038632 A | 5/2006 |

* cited by examiner

*Primary Examiner*—Scott B. Geyer
*Assistant Examiner*—Cheung Lee
(74) *Attorney, Agent, or Firm*—Townsend and Townsend and Crew LLP

(57) ABSTRACT

A method of manufacturing a semiconductor device includes forming an insulating layer, a first conductive layer, a dielectric layer and a capping conductive layer over a semiconductor substrate in which a cell region is defined. The capping conductive layer and the dielectric layer is etched to form contact holes in a first region of a drain select line and a source select line region of the cell region. A second conductive layer, a tungsten silicide layer and a hard mask layer are formed over the semiconductor substrate including the contact holes. The hard mask layer, the tungsten silicide layer, the second conductive layer, the capping conductive layer, the dielectric layer and the first conductive layer are etched to form a cell gate. The hard mask layer, the tungsten silicide layer, the second conductive layer and the first conductive layer of the first region are etched to form a drain select line and a source select line.

9 Claims, 4 Drawing Sheets

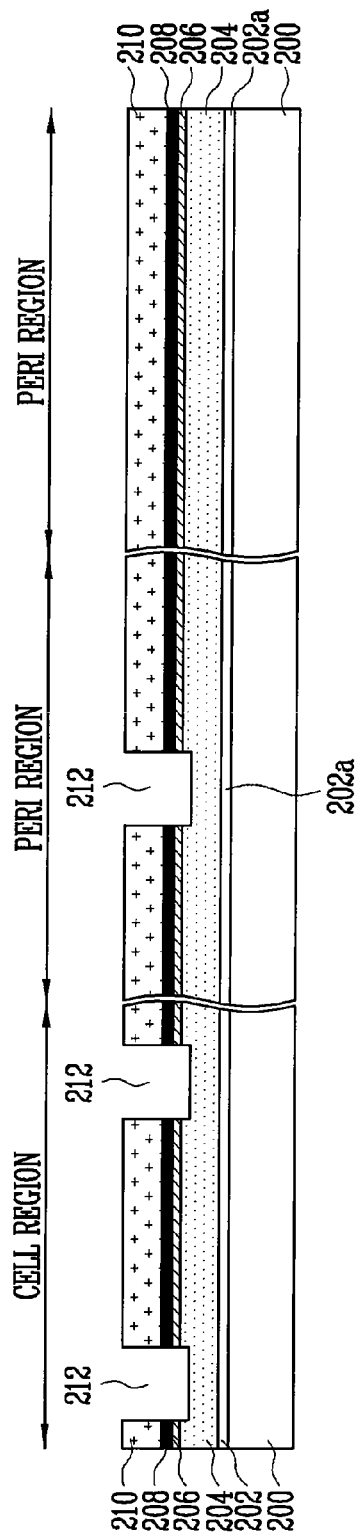
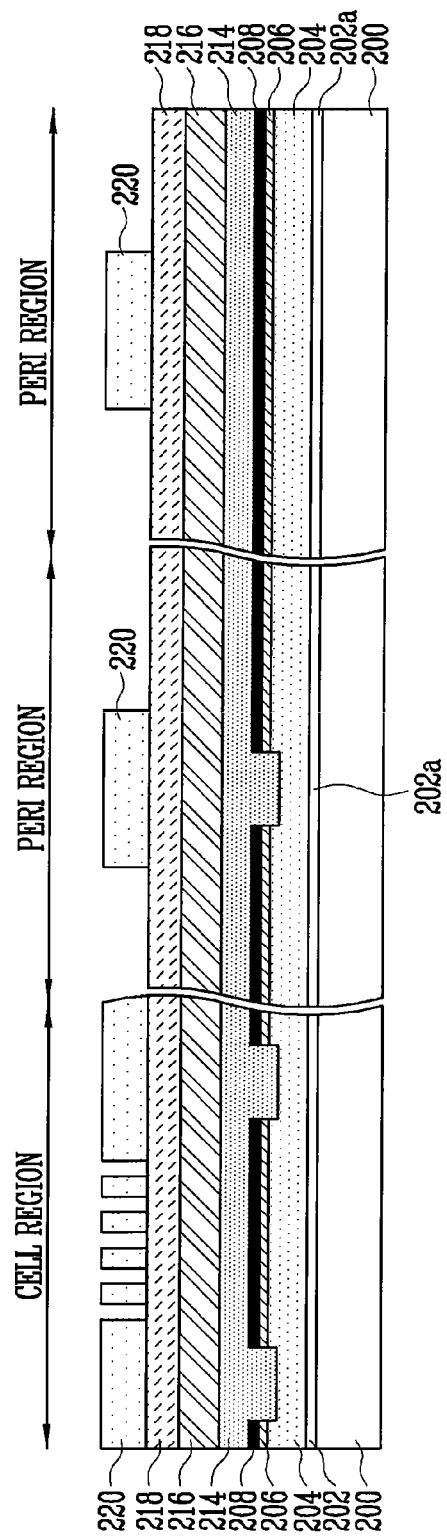

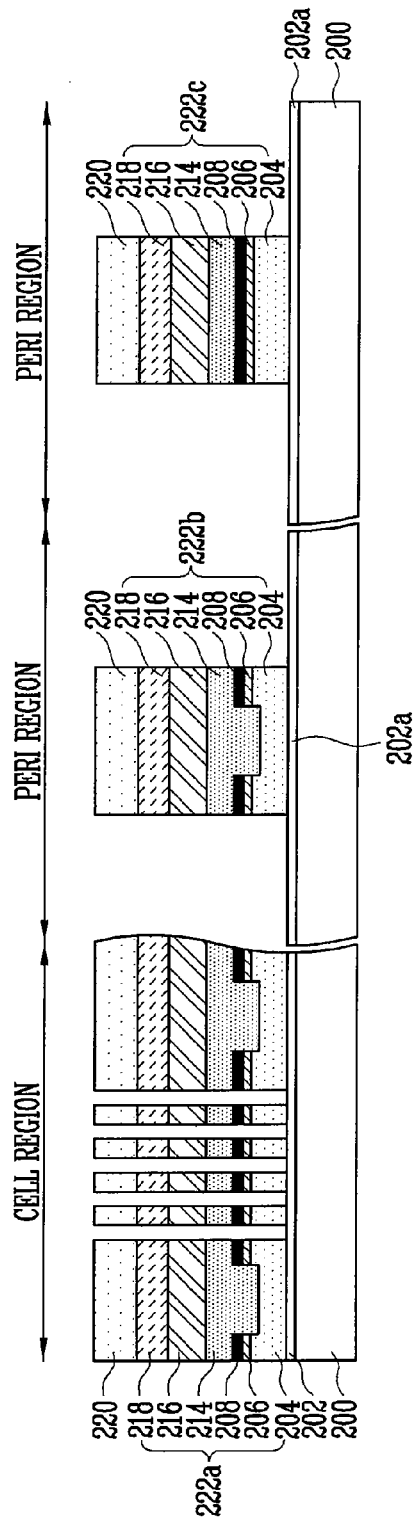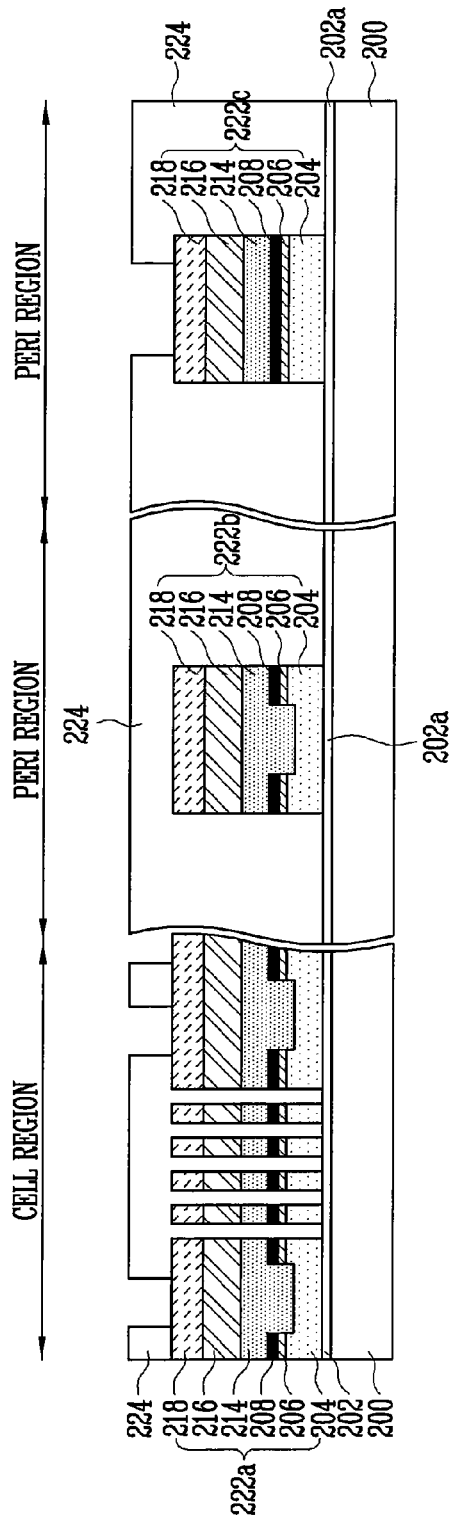

METHOD OF MANUFACTURING SEMICONDUCTOR DEVICE

CROSS-REFERENCES TO RELATED APPLICATIONS

The present application claims priority to Korean patent application number 10-2006-106626, filed on Oct. 31, 2006, which is incorporated herein by reference in its entirety.

BACKGROUND OF THE INVENTION

The present invention relates to semiconductor devices and, more particularly, to a method of manufacturing a semiconductor device, in which a Drain Select Line (DSL) and a Source Select Line (SSL) can be formed to have a desired size.

Semiconductor memory devices for storing data are commonly classified into volatile memory devices and non-volatile memory devices. Data stored in volatile memory devices is lost when power is cut off, whereas data stored in non-volatile memory devices is not lost when power is cut off. Non-volatile memory devices include flash memory devices.

Flash memory has become more popular with the advent of portable devices, such as mobile phones, PDAs, cameras, game machines and MP3 players. Flash memory is becoming more commonly used as storage media for IT technologies and home appliances. Flash memory is suitable for these applications in view of its non-volatile and low-power consumption characteristics. Flash memory is also becoming more commonly used as main storage devices in various portable devices. Research has shown that flash memory may be used in an even broader range of applications. A flash memory device having a channel length of 70 nm grade or less and having a level of integration of at least 4 Gb has been recently developed.

As the line width of a semiconductor device decreases, the sizes of various patterns constituting the semiconductor device also decrease. This results in problems associated with a drawing rule of photo scanner equipment.

As can be seen in FIG. 1, a Depth Of Focus (DOF) margin varies on a pitch basis according to ArF 100 having a wavelength of 193 nm and KrF 102 having a wavelength of 248 nm. This has a great influence on the size of a gate line and space pitch.

If ArF 100 having a wavelength of 193 nm is used in a formation process of a gate, the DSL and the SSL cannot be formed at 200 nm or less in size. Consequently, it is impossible to reduce the size of the line and space pitch and, therefore, the chip size.

Accordingly, as devices continue to become smaller, the size of the line and space pitch is also reduced.

BRIEF SUMMARY OF THE INVENTION

A method of manufacturing a semiconductor device is disclosed in which an exposure process margin may be secured, and a DSL and a SSL may be implemented at a desired size, by using a photoresist capable of defining desired pitch conditions.

In one embodiment, a method of manufacturing a semiconductor device includes forming an insulating layer, a first conductive layer, a dielectric layer and a capping conductive layer over a semiconductor substrate in which a cell region is defined. The capping conductive layer and the dielectric layer are etched to form contact holes in a first region of a drain select line and a source select line region of the cell region. A second conductive layer, a tungsten silicide layer and a hard mask layer are formed over the semiconductor substrate including the contact holes. The hard mask layer, the tungsten silicide layer, the second conductive layer, the capping conductive layer, the dielectric layer and the first conductive layer are etched to form a cell gate. The hard mask layer, the tungsten silicide layer, the second conductive layer and the first conductive layer of the first region are etched to form a drain select line and a source select line.

In another embodiment, a method of manufacturing a semiconductor device includes forming an insulating layer, a first conductive layer, a dielectric layer and a capping conductive layer over a semiconductor substrate in which a cell region and a peri region are defined. The capping conductive layer and the dielectric layer are etched to form contact holes in a drain select line and a source select line region of the cell region, and in a region of a portion of regions in which a register gate is not formed in the peri region. A second conductive layer, a tungsten silicide layer and a hard mask layer are formed over the semiconductor substrate including the contact holes. The hard mask layer, the tungsten silicide layer, the second conductive layer, the capping conductive layer, the dielectric layer and the first conductive layer are etched to form a cell gate in the cell region, and a gate for low voltage and high voltage and a register gate in the peri region. The hard mask layer, the tungsten silicide layer, the second conductive layer and the first conductive layer are etched to form a drain select line and a source select line in the cell region, while etching the hard mask layer, the tungsten silicide layer, the second conductive layer and a portion of the capping conductive layer in order to form a contact in the register gate.

BRIEF DESCRIPTION OF THE DRAWINGS

FIGS. 2A to 2E are cross-sectional views illustrating a method of manufacturing a semiconductor device according to an embodiment of the present invention.

DESCRIPTION OF SPECIFIC EMBODIMENTS

Figure 1:
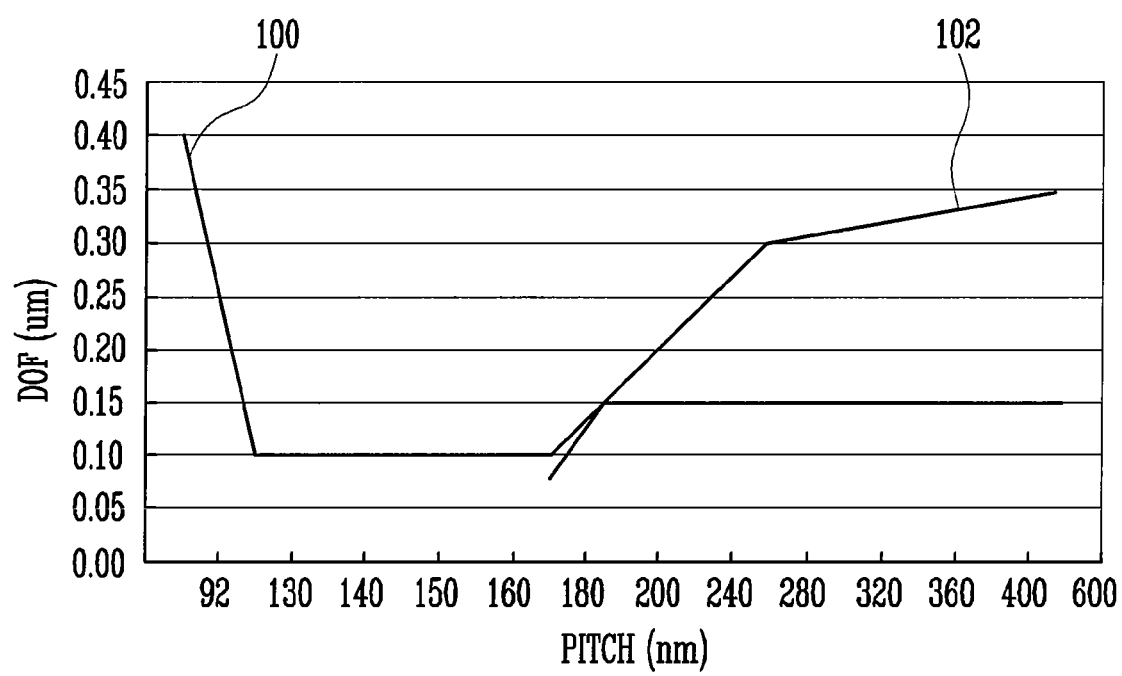
FIG. 1 is a graph illustrating a DOF margin on a pitch basis according to ArF and KrF.

A specific embodiment according to the present patent will be described with reference to the accompanying drawings. FIGS. 2A to 2E are cross-sectional views illustrating a method of manufacturing a semiconductor device according to an embodiment of the present invention.

Referring to FIG. 2A, a P-type semiconductor substrate 200 is provided in which a cell region, and a peri region having a low voltage region and a high voltage region are defined. In order to implement a well junction isolated from other transistors, a TN-well ion implantation process and a p-well ion implantation process are performed on the semiconductor substrate 200, thereby forming a TN-well junction and a p-well junction.

In order to form a shallow junction on a surface of the semiconductor substrate 200, the ion implantation process is carried out using $BF^2$ having a relatively high mass as a dopant at an ion implantation energy of approximately 5 KeV to approximately 50 KeV and at a concentration of approximately $1 \times 10^{11}$ ion/cm$^2$ to $1 \times 10^{14}$ ion/cm$^2$. In order to maximize ion collision of the dopant during ion implantation, a tilted ion implantation of approximately 3 to approximately 45 degrees is performed.

An ion implantation process for a cell threshold voltage control is performed using a p-type dopant ion. The ion implantation process is performed using $B^{11}$ having a low mass as a dopant at an ion implantation energy of approximately 5 KeV to approximately 50 KeV and a concentration of approximately $1 \times 10^{11}$ ion/cm² to $1 \times 10^{14}$ ion/cm². In order to prohibit channeling of the dopant during the ion implantation process for the cell threshold voltage control, a tilted ion implantation of approximately 1 to approximately 50 degrees is performed.

A tunnel insulating layer 202 is formed in the cell region and a gate insulating layer 202a is formed in the peri region over the semiconductor substrate 200. The tunnel insulating layer 202 and the gate insulating layer 202a may be formed from oxide.

A first conductive layer 204 for a floating gate, a dielectric layer 206 and a capping conductive layer 208 are sequentially formed over the tunnel insulating layer 202 and the gate insulating layer 202a. The first conductive layer 204 and the capping conductive layer 208 may be formed from polysilicon. A first photoresist pattern 210, through which a portion of the capping conductive layer 208 is exposed, is formed over the capping conductive layer 208.

The capping conductive layer 208 and the dielectric layer 206 are etched using the first photoresist pattern 210 as a mask, thereby forming contact holes 212 in the DSL and SSL regions of the cell region and a region in which a resistor of the peri region is not formed. During the etch process of the capping conductive layer 208 and the dielectric layer 206, a portion of a top surface of the first conductive layer 204 is removed.

Referring to FIG. 2B, after the first photoresist pattern 210 is removed, a second conductive layer 214 for a control gate, a tungsten silicide (WSix) layer 216 and a hard mask layer 218 are sequentially formed over the semiconductor substrate 200 including the capping conductive layer 208 and the contact hole 212. The second conductive layer 214 may be formed form polysilicon.

During the formation process of the second conductive layer 214, the first conductive layer 204 and the second conductive layer 214 are connected to each other since the contact holes 212 are formed in the DSL and SSL regions of the cell region and a region in which a resistor of the peri region is not formed.

In order to form a gate, a second photoresist pattern 220 is formed on the hard mask layer 218 so that a portion of the hard mask layer 218 is exposed. The second photoresist pattern 220 can be formed under exposure conditions of an ArF wavelength.

Referring to FIG. 2C, the hard mask layer 218, the WSix layer 216, the second conductive layer 214, the capping conductive layer 208, the dielectric layer 206 and the first conductive layer 204 are sequentially etched using the second photoresist pattern 220 as a mask. A cell gate 222a in which the first conductive layer 204, the dielectric layer 206, the capping conductive layer 208, the second conductive layer 214, the WSix layer 216 and the hard mask layer 218 are laminated, a gate 222b for low voltage and high voltage, and a register gate 222c are formed in the remaining regions other than the DSL and the SSL regions.

Referring to FIG. 2D, the second photoresist pattern 220 is removed. In order to form a gate in the DSL and the SSL regions and form a register contact by etching a portion of the register gate 222c formed in the peri region, a third photoresist pattern 224 is formed over the semiconductor substrate 200 including the cell gate 222a, the gate 222b, and the register gate 222c. The third photoresist pattern 224 can be formed under exposure conditions of the KrF wavelength. By employing the third photoresist pattern 224 formed under exposure conditions of the KrF wavelength, a DOF margin capable of defining an area of 200 nm or less in pitch can be secured.

Figure 2E:
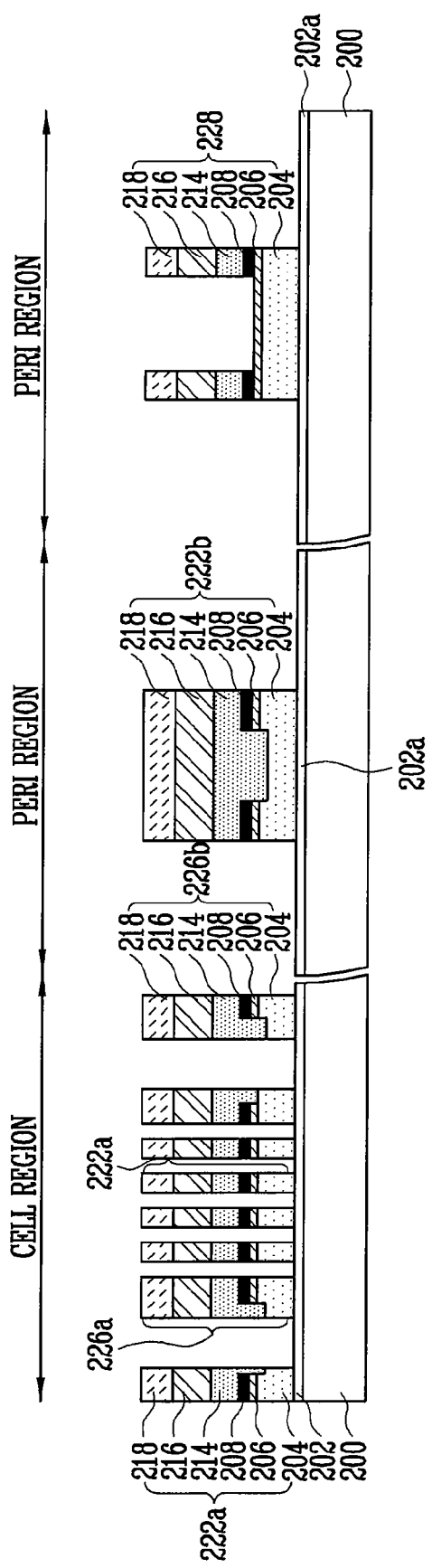

Referring to FIG. 2E, the hard mask layer 218, the WSix layer 216, the second conductive layer 214, and the first conductive layer 204 of the DSL and SSL regions are sequentially etched using the third photoresist pattern 224 as a mask. A DSL 226a and a SSL 226b are formed in which the first conductive layer 204, the dielectric layer 206, the capping conductive layer 208, the second conductive layer 214, the WSix layer 216 and the hard mask layer 218 are laminated. During the formation of the DSL 226a and the SSL 226b, the hard mask layer 218, the WSix layer 216, the second conductive layer 214 and the capping conductive layer 208 are sequentially etched in the region of the register gate 222c, so that the register contact 228 is formed. The third photoresist pattern 224 is then removed.

As described above, after the cell gate 222a, the gate 222b and the register gate 222c are formed, the DSL 226a and the SSL 226b are formed during the etch process of forming the register contact 228. Accordingly, an exposure process margin can be secured, and the DSL 226a and the SSL 226b can be implemented at a desired size.

Furthermore, the contact holes 212 are formed by etching a portion of the DSL and SSL regions of the cell region. Thus, the first conductive layer 204 for the floating gate and the second conductive layer 214 for the control gate can be connected to each other.

In addition, both the photoresist pattern 220 formed under exposure conditions of the ArF wavelength and the photoresist pattern 224 formed under exposure conditions of the KrF wavelength are employed. Accordingly, a DOF margin capable of defining an area of 200 nm or less in pitch can be secured.

The above embodiments of the present invention are illustrative and not limitative. Various alternatives and equivalents are possible. Other additions, subtractions, or modifications are obvious in view of the present disclosure and are intended to fall within the scope of the appended claims.

What is claimed is:

1. A method of manufacturing a semiconductor device, the method comprising:
   forming an insulating layer, a first conductive layer, a dielectric layer and a capping conductive layer over a semiconductor substrate in which a cell region is defined;
   etching the capping conductive layer and the dielectric layer to form contact holes in a first region of a drain select line and a source select line region of the cell region;
   forming a second conductive layer, a tungsten silicide layer and a hard mask layer over the semiconductor substrate including the contact holes;
   etching the hard mask layer, the tungsten silicide layer, the second conductive layer, the capping conductive layer, the dielectric layer and the first conductive layer to form a cell gate; and
   etching the hard mask layer, the tungsten silicide layer, the second conductive layer and the first conductive layer of the first region to form a drain select line and a source select line.

2. The method of claim 1, wherein the first conductive layer contacts the second conductive layer in the contact hole.

3. The method of claim 1, wherein the etch process for forming the cell gate employs a photoresist pattern having exposure conditions of an ArF wavelength.

4. The method of claim 1, wherein the etch process for forming the drain select line and the source select line employs a photoresist pattern having exposure conditions of a KrF wavelength.

5. The method of claim 1, wherein the hard mask layer, the tungsten silicide layer, the second conductive layer and the first conductive layer of the first region are etched to a pattern that is narrower than the contact hole.

6. A method of manufacturing a semiconductor device, the method comprising:

forming an insulating layer, a first conductive layer, a dielectric layer and a capping conductive layer over a semiconductor substrate in which a cell region and a peri region are defined;

etching the capping conductive layer and the dielectric layer to form contact holes in a drain select line and a source select line region of the cell region, and in a region of a portion of regions in which a register gate is not formed in the peri region;

forming a second conductive layer, a tungsten silicide layer and a hard mask layer over the semiconductor substrate including the contact holes;

etching the hard mask layer, the tungsten silicide layer, the second conductive layer, the capping conductive layer, the dielectric layer and the first conductive layer to form a cell gate in the cell region, and a gate for low voltage and high voltage and a register gate, in the peri region; and etching the hard mask layer, the tungsten silicide layer, the second conductive layer and the first conductive layer to form a drain select line and a source select line in the cell region, while etching the hard mask layer, the tungsten silicide layer, the second conductive layer and a portion of the capping conductive layer to form a contact in the register gate.

7. The method of claim 6, wherein the first conductive layer contacts the second conductive layer in the contact hole.

8. The method of claim 6, wherein the etch process for forming the cell gate, the gate for low voltage and high voltage, and the register gate employs a photoresist pattern having exposure conditions of an ArF wavelength.

9. The method of claim 6, wherein the etch process for forming the contact, the drain select line and the source select line employs a photoresist pattern having exposure conditions of a KrF wavelength.

* * * * *